(12) United States Patent
Takemura

(10) Patent No.: US 6,292,035 B1
(45) Date of Patent: Sep. 18, 2001

(54) SIGNAL TRANSMISSION DEVICE

(75) Inventor: Tetsuya Takemura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/307,592

(22) Filed: May 10, 1999

(30) Foreign Application Priority Data

May 13, 1998 (JP) ................................ 10-129796

(51) Int. Cl.[7] ................................ H03B 1/00; H03K 3/00
(52) U.S. Cl. ........................ 327/110; 327/112; 326/83; 326/87
(58) Field of Search .................. 327/108–112, 103, 327/268, 278, 285, 392, 398, 394, 396, 401, 443, 170, 374–377; 326/21, 27, 83, 22–26, 28, 30, 82, 84–88; 375/257

(56) References Cited

U.S. PATENT DOCUMENTS

| 5,019,719 | * | 5/1991 | King | 327/110 |
| 5,285,477 | * | 2/1994 | Leonowich | 327/110 |
| 5,506,522 | * | 4/1996 | Lee | 327/185 |
| 5,514,921 | * | 5/1996 | Steigerwald | 327/108 |
| 5,521,531 | * | 5/1996 | Okuzumi | 326/81 |
| 5,583,451 | * | 12/1996 | Sharpe-Geisler | 326/27 |

* cited by examiner

Primary Examiner—Terry D. Cunningham
Assistant Examiner—Long Nguyen
(74) Attorney, Agent, or Firm—Arent Fox Kintner Plotkin & Kahn, PLLC

(57) ABSTRACT

In a signal transmission device, when the switching transistors constituting its output stage are turned on or off, those transistors into which a current has thus far been flowing from the primary coil of a transformer are turned from on to off with a delay with respect to a time point when the other transistors are turned on or off. This reduces transient variations in the current flowing through the primary coil that occur when the switching transistors are turned on or off, and thereby reduces the back electromotive forces induced by the inductance of the coil, thus reducing the overshoots and undershoots occurring across the secondary coil.

7 Claims, 3 Drawing Sheets

SIGNAL TRANSMISSION DEVICE

BACKGROUND OF THE INVENTION

1. Field of the Invention

The present invention relates to a signal transmission device that is used to transmit a signal from a logic circuit through a transformer to another device.

2. Description of the Prior Art

Such a signal transmission device is used in a circuit that needs to meet strict requirements as to the overshoots and undershoots occurring in the circuits succeeding thereto, for example in a terminal adapter that is used to connect terminal equipment to an ISDN (integrated services digital network) line. As shown in FIG. 4, a conventional signal transmission device has, in its output stage, two pairs of serially connected P-channel and N-channel MOS transistors, QH1 and QL1 forming one pair and QH2 and QL2 forming the other pair, and an inverter circuit I for inverting the signal fed to the MOS transistors QH2 and QL2. The two ends of the primary coil L1 of a transformer are connected individually to the nodes K1 and K2 between the two transistors in those pairs. In a case where the primary coil L1 is driven so that a square wave will appear between the two ends of the secondary coil L2, the gate voltages A, B, C, and D of the individual transistors are varied as shown at (a) in FIG. 5; that is, all the transistors are turned on or off simultaneously.

In this conventional circuit configuration, however, since all the transistors are turned on or off simultaneously, large transient variations occur in the current flowing through the coil L1, and thus large back electromotive forces are induced by the inductance of the coil L1. As a result, as shown at (b) in FIG. 5, overshoots OS and undershoots US occur in the square wave E that appears between the two ends of the coil L2.

In particular, at the node (generally called the S/T point) between a terminal adapter, which is used to connect terminal equipment to an ISDN line, and a DSU (digital service unit), where an interface employing a coil is customarily used, the ISDN standards set a very strict requirements that overshoot and undershoot be within approximately 10 mV. This requirement, however, is very difficult to meet as long as the conventional circuit configuration is used.

SUMMARY OF THE INVENTION

An object of the present invention is to provide a signal transmission device that operates with reduced overshoots and undershoots.

To achieve the above object, according to one aspect of the present invention, in a signal transmission device for transmitting a signal from a logic circuit through a transformer to another device, two ends of a primary coil of the transformer are individually connected to coil driving circuits each having switching devices connected in series between a supplied voltage and a reference voltage so that the primary coil is driven by the coil driving circuits complementarily from both ends thereof, and the switching devices are turned on or off in such a way that those switching devices into which a current has thus far been flowing are turned from on to off with a delay with respect to the time point when the other switching devices are turned on or off.

According to another aspect of the present invention, a signal transmission device is provided with: logic circuits that produce a binary output on first and second lines respectively; first and second current sources; first and second delay means; a first transistor having its control electrode connected to the first line and having its first electrode connected to the first current source; a second transistor having its control electrode connected through the first delay means to the second line, having its first electrode connected to the second electrode of the first transistor, and having its second electrode connected to a predetermined voltage point; a third transistor having its control electrode connected to the second line and having its first electrode connected to the second current source; a fourth transistor having its control electrode connected through the second delay means to the first line, having its first electrode connected to the second electrode of the third transistor, and having its second electrode connected to the predetermined voltage point; a primary coil having one end connected to the second electrode of the first transistor and to the first electrode of the second transistor and having the other end connected to the second electrode of the third transistor and to the first electrode of the fourth transistor; and a secondary coil that together with the primary coil constitute a transformer. In this signal transmission device, switching of the transistors is so performed that, from the state in which the first and fourth transistors are on and the second and third transistors are off, first the second and third transistors are turned on and then, with a delay, the first and fourth transistors are turned off and that, from the state in which the second and third transistors are on and the first and fourth transistors are off, first the first and fourth transistors are turned on and then, with a delay, the second and third transistors are turned off.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
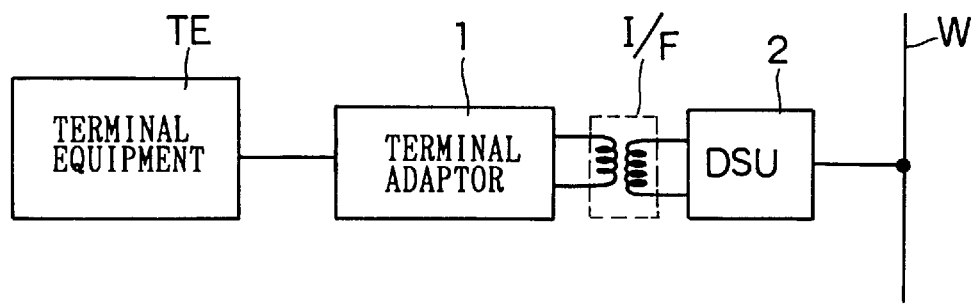
FIG. 1 is a diagram illustrating how terminal equipment is connected to an ISDN line.

Hereinafter, an embodiment of the present invention will be described with reference to the accompanying drawings. As shown in FIG. 1, to connect terminal equipment TE, such as a personal computer, to an ISDN line W, it is necessary to use a terminal adapter 1 that converts the signal from the terminal equipment TE into a signal format fit for the ISDN line W, and a DSU (digital service unit) 2 that serves as a terminating device by converting the signal carried across a signal line (network) from a telephone station into a signal fit for wiring within a home that allows bus wiring. The terminal adapter 1 and the DSU 2 are connected together through an interface I/F that employs a coil. The problem here is that the ISDN standards set a strict requirement as to the overshoots and undershoots occurring at a point where a signal is converted in some way.

Figure 2:
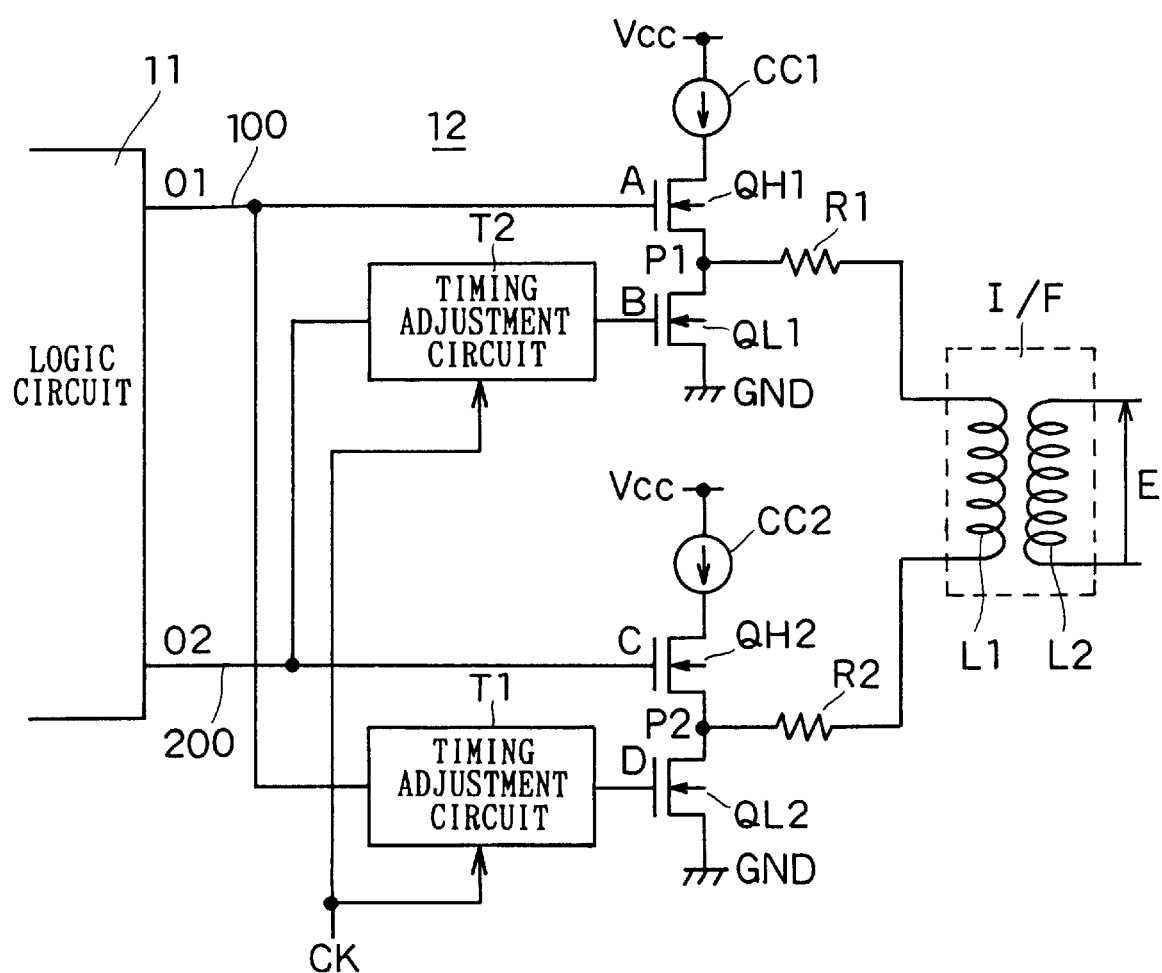
FIG. 2 is a diagram showing the circuit configuration of a terminal adapter embodying the invention.

To meet this requirement, according to one embodiment of the present invention, a terminal adapter, as is required when terminal equipment TE is connected to an ISDN line W, is configured as follows. FIG. 2 is a diagram showing the circuit configuration of a terminal adapter embodying the invention. This terminal adapter has a logic circuit 11 that converts the signal from the terminal equipment TE into a signal format fit for the ISDN line W, and an output circuit 12 that, in accordance with a first output O1 and a second output O2 from the logic circuit 11, feeds a current to the primary coil L1 that forms a part of the interface I/F to the DSU 2.

The output circuit 12 has timing adjustment circuits T1 and T2 that are fed with a clock, and N-channel MOS transistors QH1, QL1, QH2, and QL2 that perform switching operation. The transistors QH1 and QL1 on one hand, and the transistors QH2 and QL2 on the other hand, form a pair of serially connected transistors. The drains of the transistors QH1 and QH2 are connected, respectively through constant current sources CC1 and CC2 that serve to limit transient variations in the current flowing through the coil, to a supplied voltage line $V_{cc}$. The sources of the transistors QL1 and QL2 are connected to ground GND.

The gate of the transistor QH1 is connected directly to a first line 100 across which the first output O1 of the logic circuit 11 is transmitted, and the gate of the transistor QL2 is connected through the timing adjustment circuit T1 to the first line 100. The gate of the transistor QH2 is connected directly to a second line 200 across which the second output O2 of the logic circuit 11 is transmitted, and the gate of the transistor QL1 is connected through the timing adjustment circuit T2 to the second line 200. The node P1 between the transistors QH1 and QL1 and the node P2 between the transistors QH2 and QL2 are connected individually to the two ends of the coil L1 through current-limiting resistors R1 and R2, respectively.

Accordingly, when the first and second outputs O1 and O2 of the logic circuit 11 are H and L, respectively (note that, in the present specification H denotes a high level and L denotes a low level), the transistors QH1 and QL2 are on and the transistors QH2 and QL1 are off, causing the voltage appearing across the secondary coil L2 of the interface I/F to have a first polarity (an L state). By contrast, when the first and second outputs O1 and O2 are L and H, respectively, the transistors QH2 and QL1 are on and the transistors QH1 and QL2 are off, causing the voltage appearing across the secondary coil L2 to have a second polarity (an H state). Moreover, when the first and second outputs O1 and O2 are both L, all of the transistors QH1, QL1, QH2, and QL2 are off, with no current flowing through the coil L1, and thus with no voltage appearing across the coil L2 (an M state). Note that it never occurs that the first and second outputs O1 and O2 are both H at the same time. Note also that the level appearing in an M state is a middle level between those appearing in an H state and in an L state.

Next, how the timing adjustment circuits T1 and T2 operate will be described. The two timing adjustment circuits T1 and T2 have the same circuit configuration; specifically, when their input rises to a high level, they turn their output to a high level irrespective of the clock CK fed thereto, and, when their input drops to a low level, they turn their output to a low level after counting a predetermined number of pulses in the clock CK fed thereto. More specifically, in the latter case, the timing adjustment circuits T1 and T2 turn their output to a low level at the second rising edge of the clock CK, i.e. with a delay of about 170 nS given that the clock CK is the one used in the logic circuit 11 and has a frequency of 6 MHz. This makes it possible to provide a short delay stably without reducing the data transfer rate.

Figure 3:
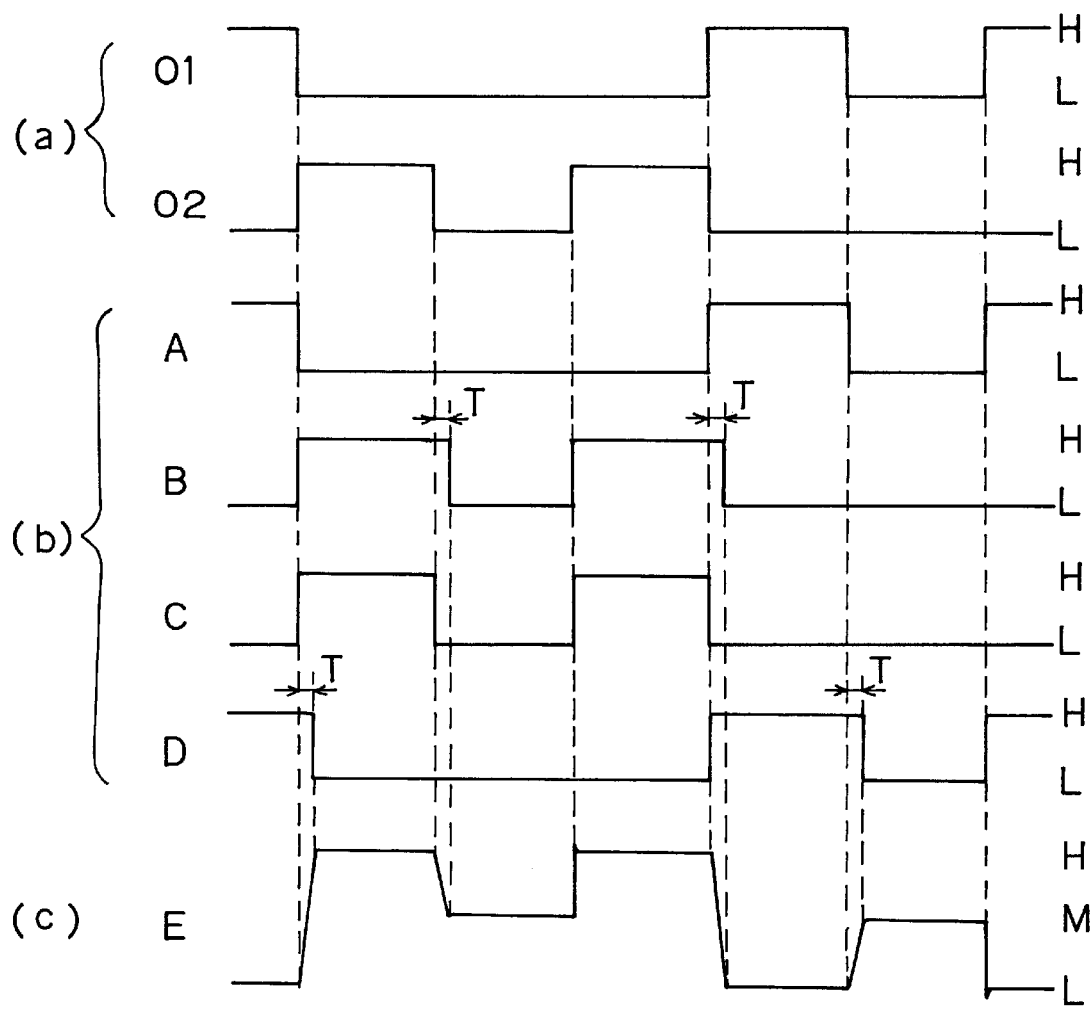
FIG. 3 is a diagram showing the time chart of the signals observed at various points in the terminal adapter shown in FIG. 2.
Figure 4:
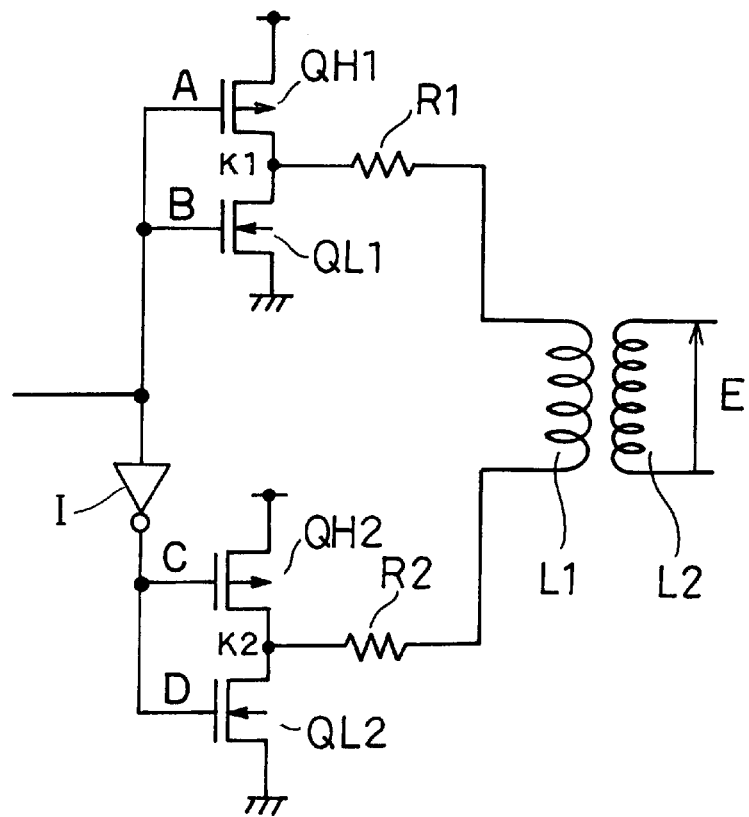
FIG. 4 is a diagram showing a conventional signal transmission device.
Figure 5:
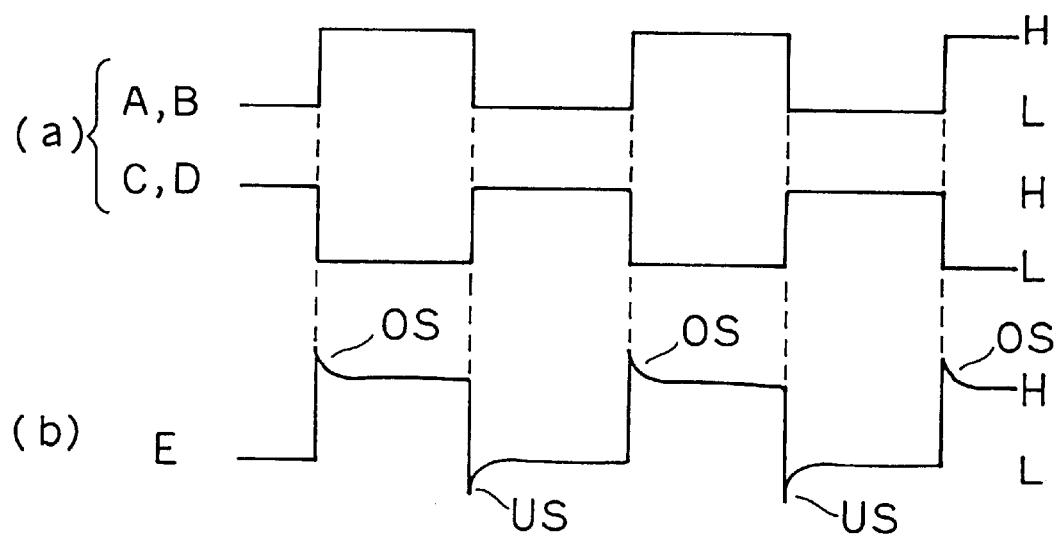
FIG. 5 is a diagram showing the time chart of the signals observed at various points in the conventional signal transmission device shown in FIG. 4.

According to this circuit configuration, when the first and second outputs O1 and O2 of the logic circuit 11 change their levels as shown at (a) in FIG. 3, the gate voltages A, B, C, and D of the transistors QH1, QL1, QH2, and QL2 change as shown at (b) in FIG. 3. Specifically, at the level-shift points where the first and second outputs O1 and O2 of the logic circuit 11 change their levels from H and L to L and H, from L and H to H and L, from H and L to L and L, and from L and H to L and L, those transistors into which a current has been flowing until the first and second outputs O1 and O2 of the logic circuit 11 change their levels are turned off with a predetermined delay T determined by the timing adjustment circuits T1 and T2 with respect to the time point when the other transistors are turned on.

This reduces transient variations in the current flowing through the coil L1, and thereby reduces the back electromotive forces induced by the inductance of the coil L1. As a result, as shown at (c) in FIG. 3, it is possible to reduce greatly the overshoots and undershoots occurring in the square wave E appearing across the coil L2.

Note that, at the level-shift points where the first and second outputs O1 and O2 of the logic circuit 11 change their levels from L and L to H and L and from L and L to L and H, i.e. when the square wave appearing across the coil L2 changes its state from M to L and from M to H, even if all the transistors are turned on or off simultaneously, only small variations occur in the output voltage, causing only harmless overshoots and undershoots. Accordingly, at these level-shift points, in contrast to the other level-shift points mentioned previously, all the transistors are turned on or off without a delay.

In short, with the terminal adapter of the embodiment described above, it is possible to obtain a ternary (i.e. three-valued) square wave with reduced overshoots and undershoots, and thus it is easy to meet the requirement of the ISDN standards.

It is also possible to adjust the timing with which the transistors are turned on or off by making "blunt" the voltages applied to their gates on an analog basis. However, by this method, it is difficult to obtain the desired timing and it is inevitable to use a complicated circuit. By contrast, according to the embodiment described above, the level-shift points of the digital signals applied to the gates of the transistors are shifted, and this can be achieved easily, for example, by the use of flip-flops, and thus in a relatively simple circuit.

In the embodiment described above, N-channel MOS transistors are used, and therefore the voltage across the coil L1 is lower than the supplied voltage. However, it is also possible to use P-channel transistors as the transistors QH1 and QH2 so as to make the voltage applied across the coil L1 as high as the supplied voltage and thereby maximize the voltage appearing across the coil L2.

It is possible to design the logic circuit 11 to produce only a single output and instead produce the voltages applied to the gates of the transistors by the use of an inverter. It is possible to provide more than two switching devices. It is possible to use bipolar transistors as the switching devices.

As described heretofore, with a signal conversion device according to the embodiment described above, it is possible to reduce transient variations in the current flowing through a coil, and thereby reduce the back electromotive forces induced by the inductance of the coil. Thus, it is possible to reduce overshoots and undershoots.

What is claimed is:

1. A signal transmission device for transmitting a signal from a logic circuit through a transformer to another device, wherein two ends of a primary coil of the transformer are individually connected to coil driving circuits each having switching devices connected in series between a supplied voltage and a reference voltage so that the primary coil is driven by the coil driving circuits complementarily from both ends thereof, and when the supplied-voltage-side switching device of one of the coil driving circuits and the reference-voltage-side switching device of the other of the coil driving circuits are turned from on to off, first the supplied-voltage-side switching device is turned from on to off and then, with a delay, the reference-voltage-side switching device is turned from on to off.

2. A signal transmission device comprising:
a logic circuit that produces a binary output on first and second lines respectively;
first and second current sources;
first and second delay means;
a first transistor having a control electrode connected to the first line and having a first electrode connected to the first current source;
a second transistor having a control electrode connected through the first delay means to the second line, having a first electrode connected to a second electrode of the first transistor, and having a second electrode connected to a predetermined voltage point;
a third transistor having a control electrode connected to the second line and having a first electrode connected to the second current source;
a fourth transistor having a control electrode connected through the second delay means to the first line, having a first electrode connected to a second electrode of the third transistor, and having a second electrode connected to the predetermined voltage point;
a primary coil having one end connected to the second electrode of the first transistor and to the first electrode of the second transistor and having another end connected to the second electrode of the third transistor and to the first electrode of the fourth transistor; and
a secondary coil that together with the primary coil constitute a transformer,
wherein switching of the transistors is so performed that, in transition from a state in which the first and fourth transistors are on and the second and third transistors are off to a state in which the second and third transistors are on and the first and fourth transistors are off, first the first transistor is turned from on to off and thereafter the fourth transistor is turned from on to off, and, in transition from a state in which the second and third transistors are on and the first and fourth transistors are off to a state in which the first and fourth transistors are on and the second and third transistors are off, first the third transistor is turned from on to off and thereafter the second transistor is turned from on to off.

3. A signal transmission device for transmitting an output signal from terminal equipment to a communications network line, comprising:
a logic circuit that produces a binary output on first and second lines respectively;
first and second current sources;
first and second delay means;
a first transistor having a control electrode connected to the first line and having a first electrode connected to the first current source;
a second transistor having a control electrode connected through the first delay means to the second line, having a first electrode connected to a second electrode of the first transistor, and having a second electrode connected to a predetermined voltage point;
a third transistor having a control electrode connected to the second line and having a first electrode connected to the second current source;
a fourth transistor having a control electrode connected through the second delay means to the first line, having a first electrode connected to a second electrode of the third transistor, and having a second electrode connected to the predetermined voltage point;
a primary coil having one end connected to the second electrode of the first transistor and to the first electrode of the second transistor and having another end connected to the second electrode of the third transistor and to the first electrode of the fourth transistor; and
a secondary coil that together with the primary coil constitute a transformer,
wherein switching of the transistors is so performed that, in transition from a state in which the first and fourth transistors are on and the second and third transistors are off to a state in which the second and third transistors are on and the first and fourth transistors are off, first the first transistor is turned from on to off and thereafter the fourth transistor is turned from on to off, and, in transition from a state in which the second and third transistors are on and the first and fourth transistors are off to a state in which the first and fourth transistors are on and the second and third transistors are off, first the third transistor is turned from on to off and thereafter the second transistor is turned from on to off.

4. A signal transmission device as claimed in claim 3, wherein the transformer constitutes an interface.

5. A signal transmission device comprising:
a logic circuit that produces a binary output on first and second lines respectively;
first and second current sources;
first and second delay means;
a first transistor having a control electrode connected to the first line and having a first electrode connected to the first current source;
a second transistor having a control electrode connected through the first delay means to the second line, having a first electrode connected to a second electrode of the first transistor, and having a second electrode connected to a predetermined voltage point;
a third transistor having a control electrode connected to the second line and having a first electrode connected to the second current source;
a fourth transistor having a control electrode connected through the second delay means to the first line, having a first electrode connected to a second electrode of the third transistor, and having a second electrode connected to the predetermined voltage point;
a primary coil having one end connected to the second electrode of the first transistor and to the first electrode of the second transistor and having another end connected to the second electrode of the third transistor and to the first electrode of the fourth transistor; and a secondary coil that together with the primary coil constitute a transformer, wherein switching of the transistors is so performed that, in transition from a state in which the first and fourth transistors are on and the second and third transistors are off to a state in which the first, second, third, and fourth transistors are all of, first the first transistor is turned from on to off and thereafter the fourth transistor is turned from on to off, and, in transition from a state in which the second and third transistors are on and the first and fourth transistors are off to a state in which the first, second, third, and fourth transistors are all off, first the third transistor is turned from on to off and thereafter the second transistor is turned from on to off.

6. A signal transmission device for transmitting an output signal from terminal equipment to a communications network line, comprising:

a logic circuit that produces a binary output on first and second lines respectively;

first and second current sources;

first and second delay means;

a first transistor having a control electrode connected to the first line and having a first electrode connected to the first current source;

a second transistor having a control electrode connected through the first delay means to the second line, having a first electrode connected to a second electrode of the first transistor, and having a second electrode connected to a predetermined voltage point;

a third transistor having a control electrode connected to the second line and having a first electrode connected to the second current source;

a fourth transistor having a control electrode connected through the second delay means to the first line, having a first electrode connected to a second electrode of the third transistor, and having a second electrode connected to the predetermined voltage point;

a primary coil having one end connected to the second electrode of the first transistor and to the first electrode of the second transistor and having another end connected to the second electrode of the third transistor and to the first electrode of the fourth transistor; and a secondary coil that together with the primary coil constitute a transformer, wherein switching of the transistors is so performed that, in transition from a state in which the first and fourth transistors are on and the second and third transistors are off to a state in which the first, second, third, and fourth transistors are all off, first the first transistor is turned from on to off and thereafter the fourth transistor is turned from on to off, and, in transition from a state in which the second and third transistors are on and the first and fourth transistors are off to a state in which the first, second, third, and fourth transistors are all off, first the third transistor is turned from on to off and thereafter the second transistor is turned from on to off.

7. A signal transmission device as claimed in claim 6, wherein the transformer constitutes an interface.

* * * * *